(12) United States Patent
Stoltz

(10) Patent No.: US 9,998,108 B2
(45) Date of Patent: Jun. 12, 2018

(54) DRIVE CIRCUIT AND METHOD OF USING THE SAME

(75) Inventor: Thomas J. Stoltz, Southfield, MI (US)

(73) Assignee: Eaton Intelligent Power Limited, Dublin (IE)

( * ) Notice: Subject to any disclaimer, the term of this patent is extended or adjusted under 35 U.S.C. 154(b) by 1778 days.

(21) Appl. No.: 12/343,774

(22) Filed: Dec. 24, 2008

(65) Prior Publication Data

US 2009/0195235 A1    Aug. 6, 2009

Related U.S. Application Data

(60) Provisional application No. 61/006,197, filed on Dec. 28, 2007.

(51) Int. Cl.
*H02M 1/32* (2007.01)
*H03K 17/08* (2006.01)

(52) U.S. Cl.
CPC .............. *H03K 17/08* (2013.01); *H02M 1/32* (2013.01)

(58) Field of Classification Search
USPC ....... 323/223, 229, 242, 317, 333, 349, 351; 361/155; 363/15, 19, 56.03, 63
See application file for complete search history.

(56) References Cited

U.S. PATENT DOCUMENTS

| | | | |
|---|---|---|---|
| 3,541,358 A | 11/1970 | Morgan | |
| 4,492,913 A * | 1/1985 | Arnold et al. | 323/282 |
| 5,610,790 A * | 3/1997 | Staab et al. | 361/56 |
| 5,675,169 A | 10/1997 | Hoshi et al. | |
| 6,366,063 B1 * | 4/2002 | Sekii | 323/223 |
| 6,809,504 B2 * | 10/2004 | Tang et al. | 323/274 |
| 6,870,355 B2 * | 3/2005 | Iwahori | 323/351 |
| 7,586,768 B2 | 9/2009 | Yoshimoto | |
| 7,667,349 B2 * | 2/2010 | Nielsen | 307/53 |
| 2007/0057704 A1 | 3/2007 | Yokoo | |
| 2007/0182477 A1 * | 8/2007 | Kim | 327/539 |
| 2007/0188967 A1 * | 8/2007 | Smith et al. | 361/155 |

FOREIGN PATENT DOCUMENTS

| | | |
|---|---|---|
| EP | 0088312 A2 | 9/1983 |
| JP | 11-224822 | 8/1999 |
| JP | 2007202387 A | 8/2007 |

OTHER PUBLICATIONS

International Search Report for PCT/US2008/088288.
English Language Abstract of JP 11-224822.

* cited by examiner

*Primary Examiner* — Jeffrey Gblende
(74) *Attorney, Agent, or Firm* — Fishman Stewart PLLC

(57) ABSTRACT

A drive circuit may include a SUPPLY that outputs a first voltage potential, an energy storage device that outputs a second voltage potential, and a LOAD. Switches control the flow of current through the LOAD in a flow direction or in a direction opposite to the flow direction. The first or second voltage potentials can produce current.

23 Claims, 13 Drawing Sheets

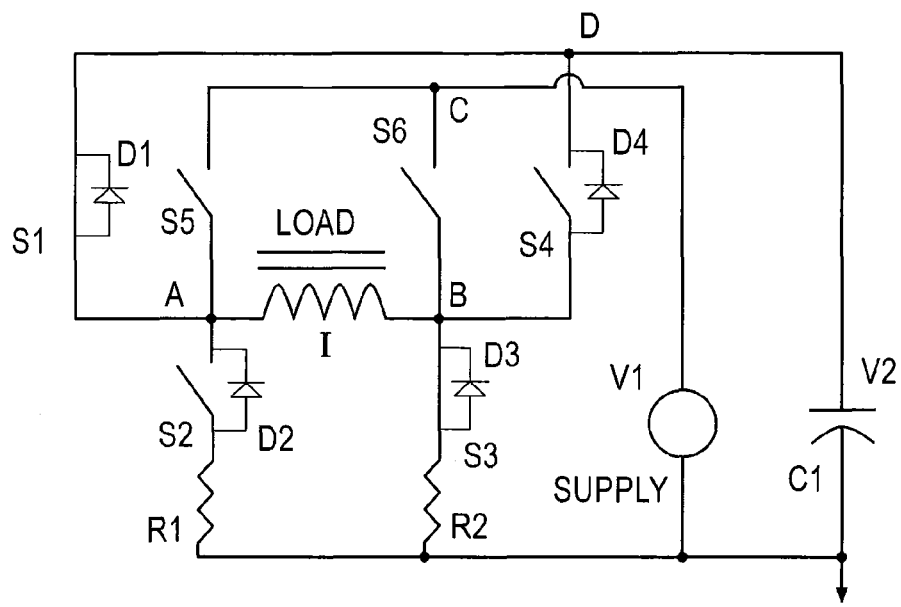
FIG. 3A
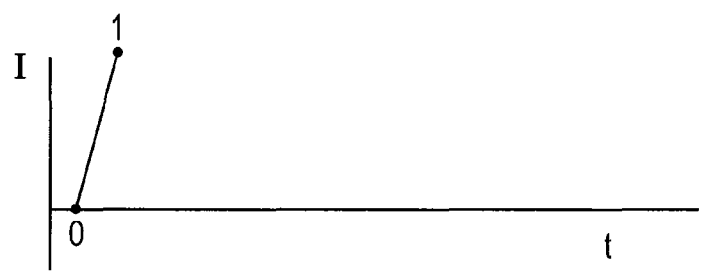
FIG. 3B
| Switch | S1 | S2 | S3 | S4 | S5 | S6 |
|---|---|---|---|---|---|---|
| Open |  | x |  | x | x | x |
| Closed | x |  | x |  |  |  |
FIG. 3C

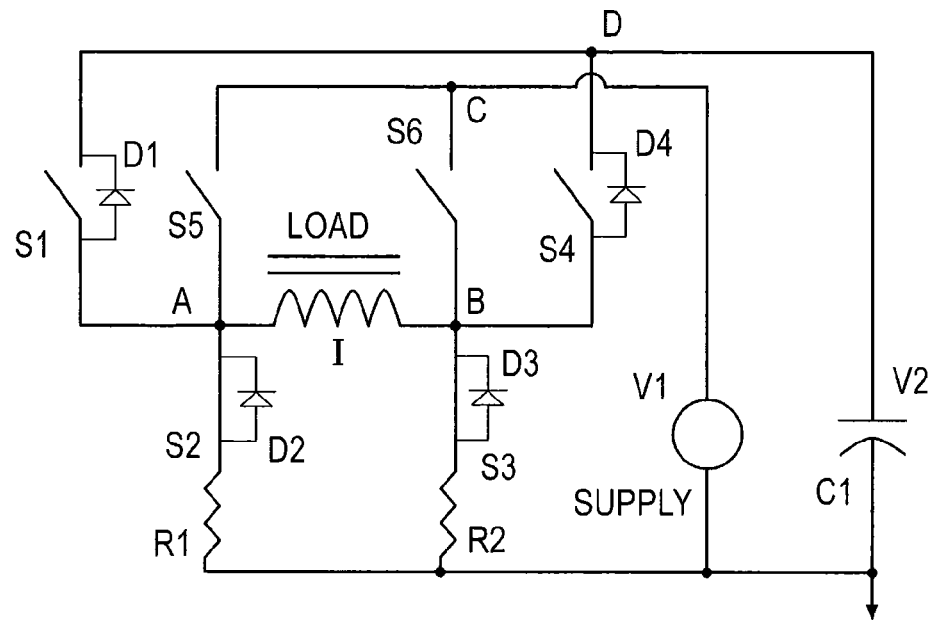
FIG. 4A
FIG. 4B
| Switch | S1 | S2 | S3 | S4 | S5 | S6 |
|--------|----|----|----|----|----|----|
| Open   | x  |    |    | x  | x  | x  |
| Closed |    | x  | x  |    |    |    |
FIG. 4C Coil Slow-Drive
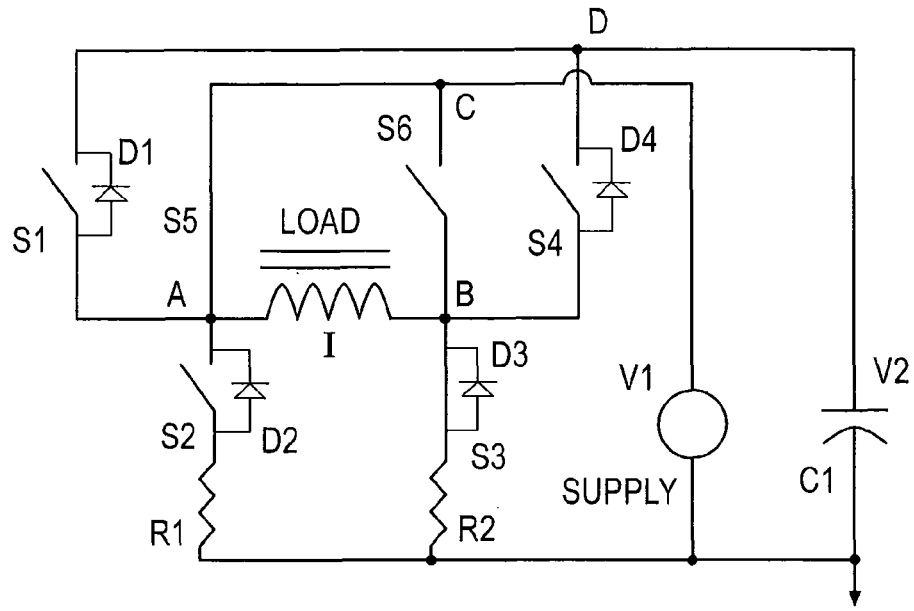
FIG. 5A
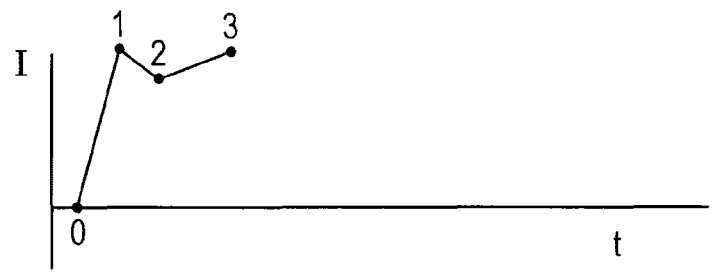
FIG. 5B
| Switch | S1 | S2 | S3 | S4 | S5 | S6 |
|---|---|---|---|---|---|---|
| Open | x | x | | x | | x |
| Closed | | | x | | x | |
FIG. 5C Coil Fast-Stop / Regenerate
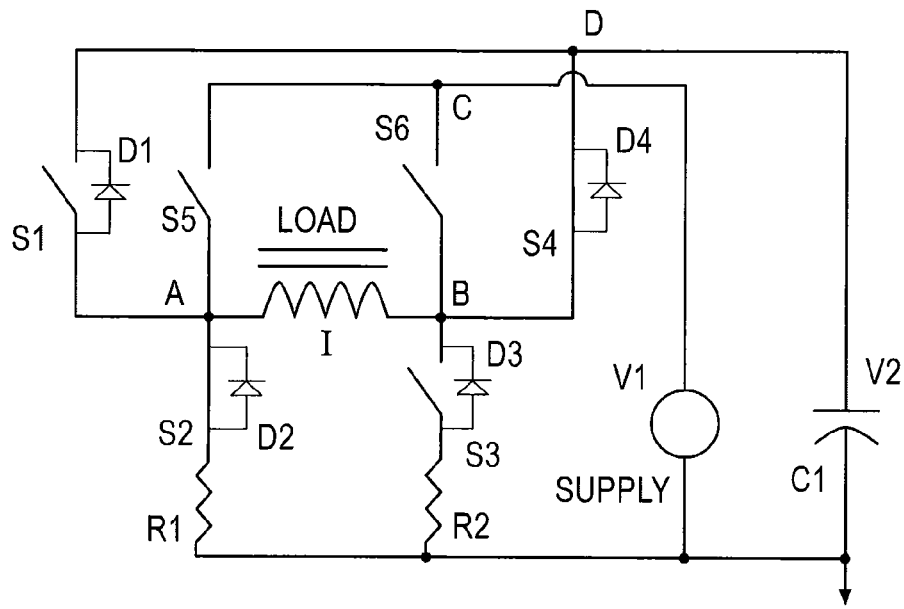
FIG. 6A
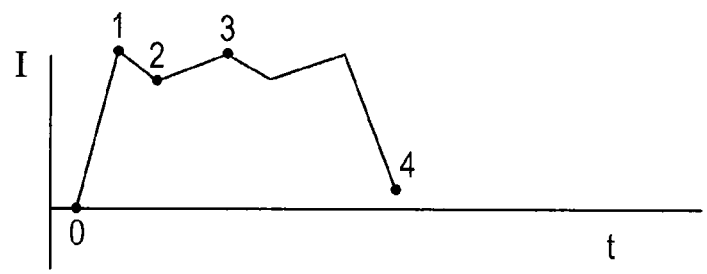
FIG. 6B
| Switch | S1 | S2 | S3 | S4 | S5 | S6 |
|---|---|---|---|---|---|---|
| Open | x | | x | | x | x |
| Closed | | x | | x | | |
FIG. 6C Coil Idle
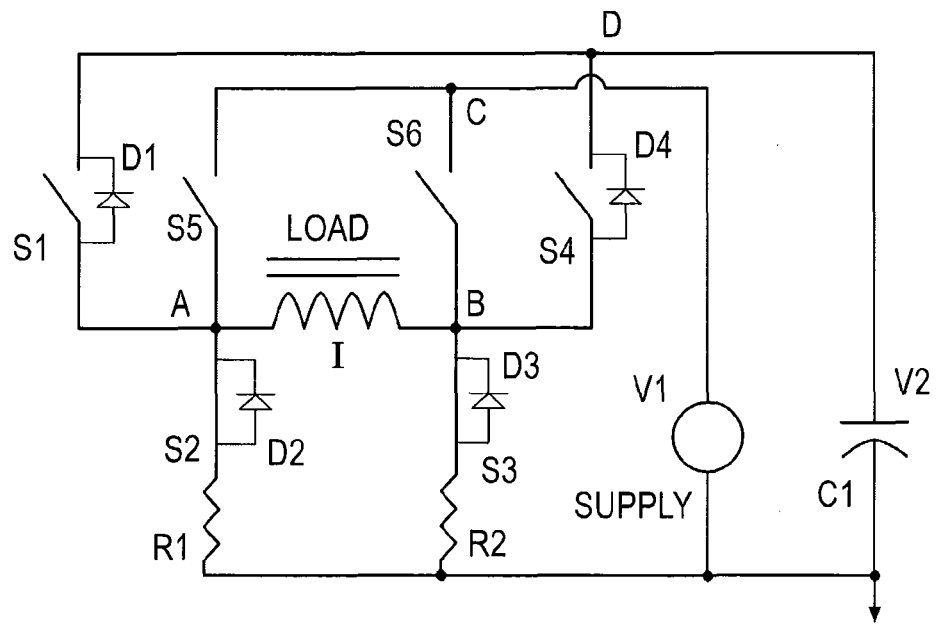
FIG. 7A
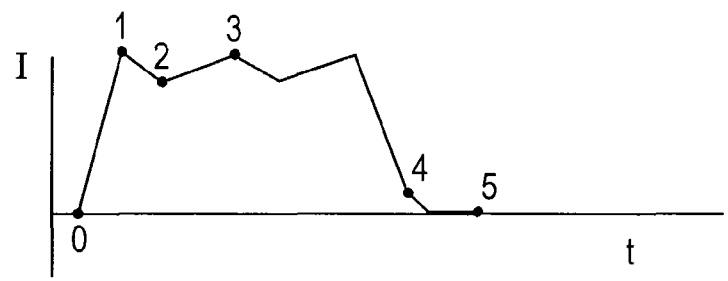
FIG. 7B
| Switch | S1 | S2 | S3 | S4 | S5 | S6 |
|---|---|---|---|---|---|---|
| Open | x | | | x | x | x |
| Closed | | x | x | | | |
FIG. 7C Coil Demagnetization
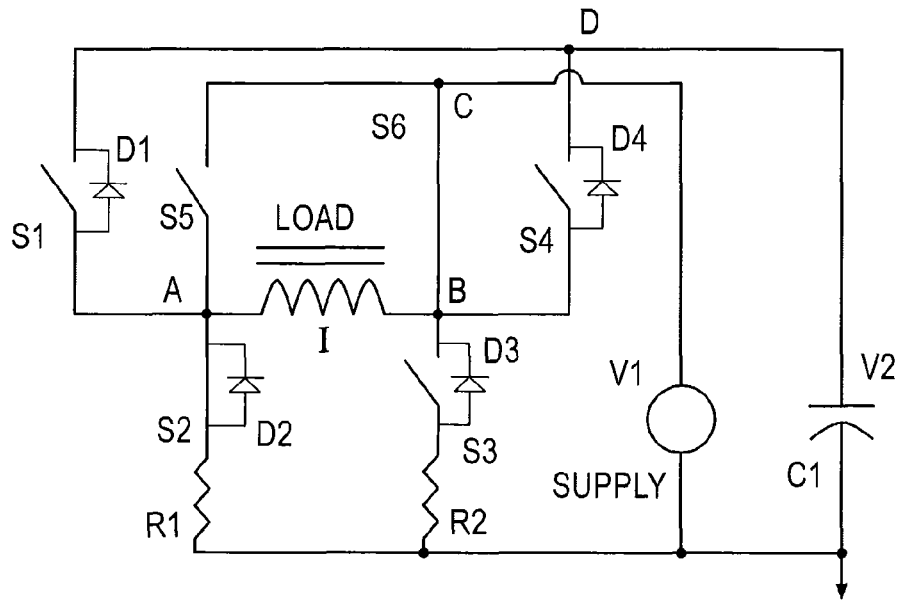
FIG. 8A
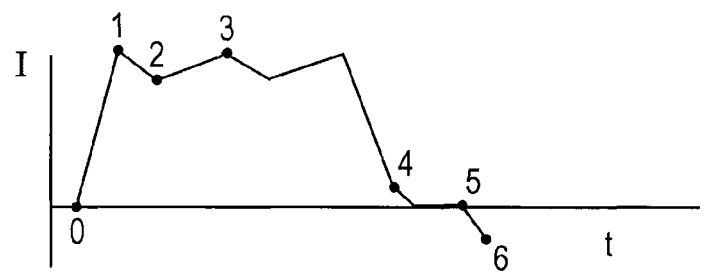
FIG. 8B
| Switch | S1 | S2 | S3 | S4 | S5 | S6 |
|--------|----|----|----|----|----|----|
| Open   | x  |    | x  | x  | x  |    |
| Closed |    | x  |    |    |    | x  |
FIG. 8C Coil Inverse Cap Re-Charge
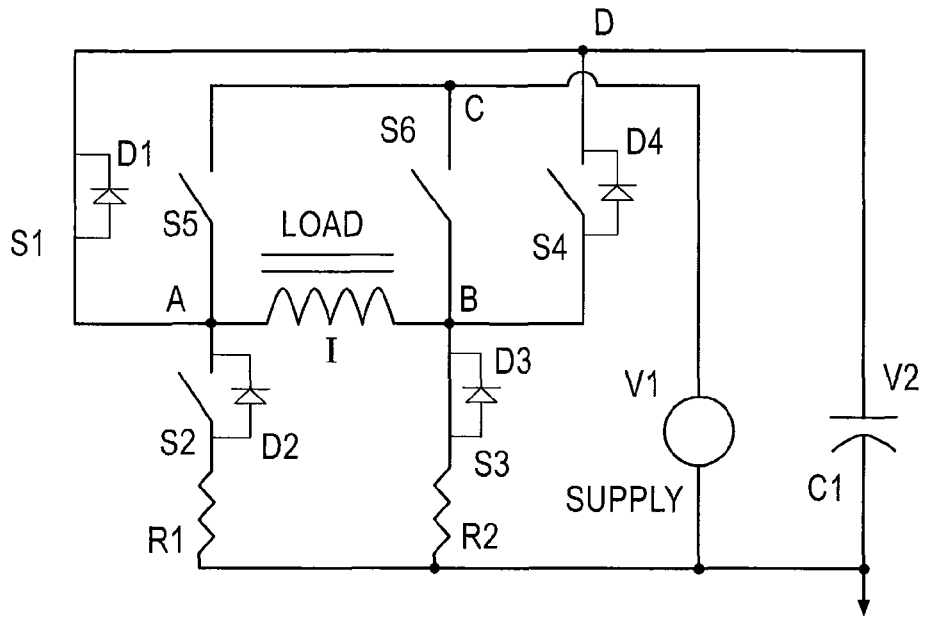
FIG. 9A
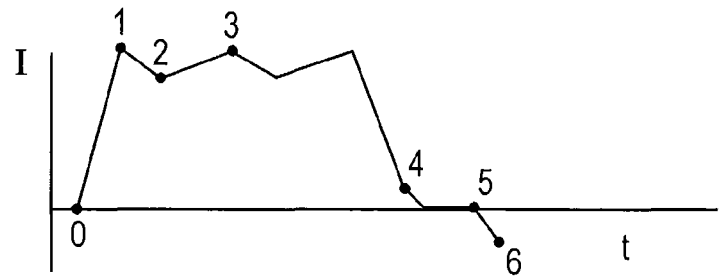
FIG. 9B
| Switch | S1 | S2 | S3 | S4 | S5 | S6 |
|--------|----|----|----|----|----|----|
| Open   |    | x  |    | x  | x  | x  |
| Closed | x  |    | x  |    |    |    |
FIG. 9C Coil Slow-Drive
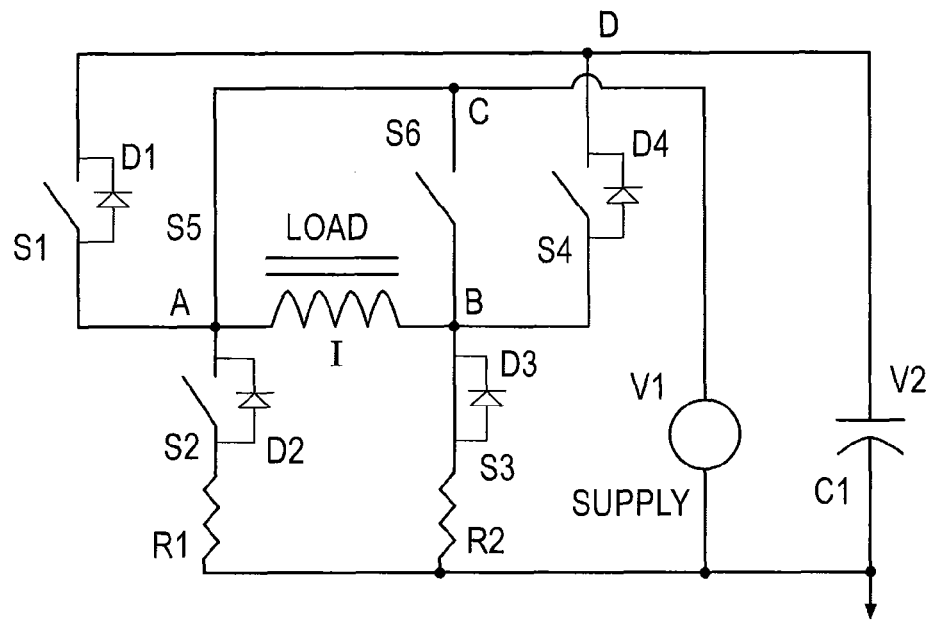
*FIG. 10A*
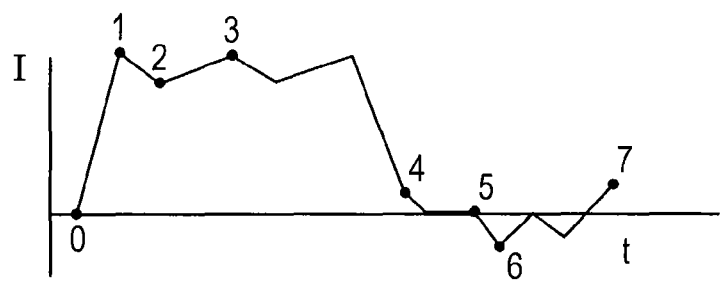
*FIG. 10B*
| Switch | S1 | S2 | S3 | S4 | S5 | S6 |
|--------|----|----|----|----|----|----|
| Open   | x  | x  |    | x  |    | x  |
| Closed |    |    | x  |    | x  |    |
*FIG. 10C*

Coil Fast-Stop / Regenerate
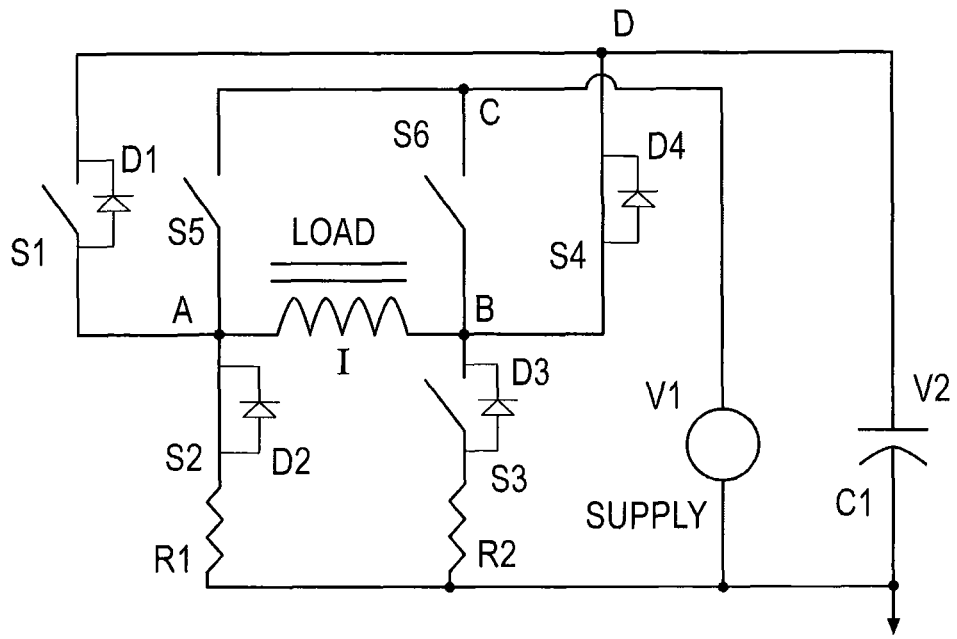
FIG. 11A
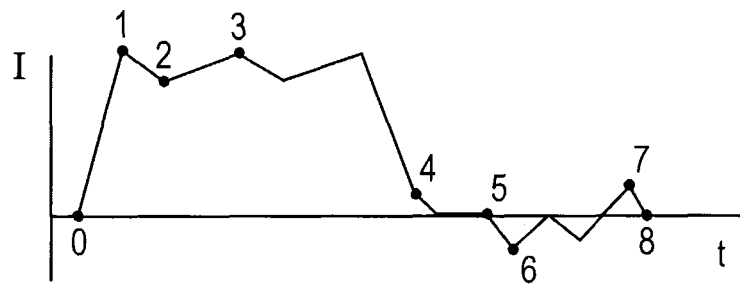
FIG. 11B
| Switch | S1 | S2 | S3 | S4 | S5 | S6 |
|---|---|---|---|---|---|---|
| Open | x | | x | | x | x |
| Closed | | x | | x | | |
FIG. 11C

DRIVE CIRCUIT AND METHOD OF USING THE SAME

CROSS REFERENCE TO RELATED APPLICATIONS

The present application claims the benefit of U.S. Provisional Application No. 61/006,197 filed on Dec. 28, 2007, the entire contents being incorporated herein by reference.

FIELD OF THE INVENTION

This relates generally to an apparatus and process for controlling currents through a load, more specifically, this relates to a drive circuit and a method of operating a drive circuit.

BACKGROUND OF THE INVENTION

An electrical load can be driven by an electrical circuit such as an H-bridge circuit. Switches in the branches of the "H" of the H-bridge circuit can allow control over the direction of current flow through the electrical load.

However, there is a desire for an electrical circuit that can control the rate of increase or decrease of the current through the electrical load.

BRIEF DESCRIPTION OF THE DRAWINGS

Referring now to the drawings, exemplary illustrations are shown in detail. Although the drawings represent some examples, the drawings are not necessarily to scale and certain features may be exaggerated, removed, or partially sectioned to better illustrate and explain the present invention. Further, the exemplary illustrations set forth herein are not intended to be exhaustive or otherwise limit or restrict the claims to the precise forms and configurations shown in the drawings and disclosed in the following detailed description:

FIGS. 3A, 3B, and 3C depict a Coil Fast-Drive mode.

FIGS. 4A, 4B, and 4C depict a Coil Recirculation mode.

FIGS. 5A, 5B, and 5C depict a Coil Slow-Drive mode.

FIGS. 6A, 6B, and 6C depict a Coil Fast-Stop/Regenerate mode.

FIGS. 7A, 7B, and 7C depict a Coil Idle mode.

FIGS. 8A, 8B, and 8C depict a Coil Demagnetization mode.

FIGS. 9A, 9B, and 9C depict a Coil Inverse Cap Re-Charge mode.

FIGS. 10A, 10B, and 10C depict a Coil Slow-Drive mode.

FIGS. 11A, 11B, and 11C depict a Coil Fast-Stop/Regenerate mode.

DETAILED DESCRIPTION

Electrical loads can be driven by an H-bridge circuit. The H-bridge circuit may include a combination of switches or switching devices arranged such that voltages from voltage supplies can be applied to a load. By adding additional pairs of switches to separate supply rails, voltages from several different voltage supplies can be applied to the load in either a positive or negative polarity. Additional voltage supplies can be standard voltage supplies or can be capacitor banks that allow energy to be injected into the load or recovered from the load, increasing efficiency through regeneration from kinetic or inductive devices. Alternating the drive polarity to avoid building residual magnetic fields is also possible.

Figure 1:
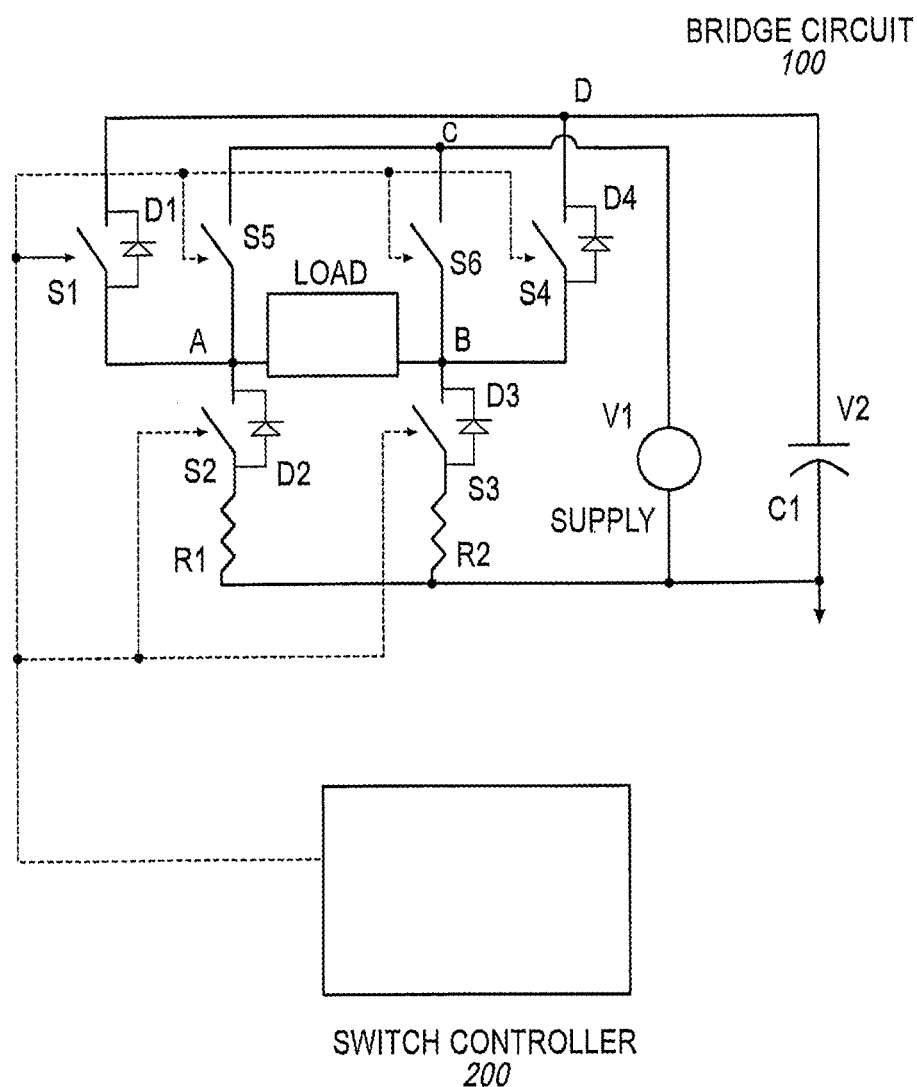
FIG. 1 is a simplified schematic diagram for an exemplary illustration of a drive circuit.

FIG. 1 is a simplified schematic diagram of an exemplary system including a bridge circuit (100) and a switch controller (200). The exemplary bridge circuit (100) may include a SUPPLY, a capacitor (C1), a LOAD, switches (S1-S6), diodes (D1-D4), and resistors (R1, R2). While a specific number of switches, diodes and resistors are illustrated, the actual number of components will depend on the specific circumstances of use.

As a power source for the bridge circuit (100), the SUPPLY provides a voltage potential (V1) sufficient to drive the LOAD. A current generated by this voltage potential is flowable through the LOAD in a flow direction and in a direction opposite to the flow direction. The LOAD, in accordance with one exemplary approach, may be an inductive solenoid. Moreover, the LOAD may be a DC motor. Any other electrical device as being the LOAD is also acceptable. Each of the switches (S1-S6) is connected to the LOAD. Through the use of the switches (S1-S6), the voltage potential (V1) may be applied to the LOAD as a positive or negative polarity voltage, as explained below. The SUPPLY being a battery or a power supply are two examples of possible approaches. The SUPPLY may be a DC voltage source.

Another power source for the bridge circuit (100) may include an energy storage device that supplies a voltage potential (V2) to the LOAD. A current generated by this voltage potential is flowable through the LOAD in a flow direction and in a direction opposite to the flow direction. This energy storage device may be a rechargeable energy storage device. A capacitor (C1) is shown within the Figures as an energy storage device for the bridge circuit (100). Although the examples below show the energy storage device as the capacitor (C1), other devices such as a battery or a power supply for the energy storage device may be used. The energy storage device may be a DC voltage source.

To direct the flow of current through the bridge circuit (100), the switches (S1-S6) are controllable by control logic in a switch controller (200). The switches (S1-S6) may be an electrical switching device such as solid state device, a transistor, a relay, or other switching devices. This electrical switching device may include a semiconductor switch, a metal-oxide field effect transistor (MOSFET), a field effect transistor (FET), a bipolar junction transistor (BJT), a silicon controlled rectifier (SCR), or an insulated gate bipolar transistor. (IGBT). The switch controller (200) may be a microprocessor, a state machine, a controlling device, or other combinational logic among exemplary possibilities. The switch controller (200) controls switch closures and openings as explained below in referring to FIGS. 3A through 13. In simplifying the Figures, however, the switch controller (200) is not depicted within FIGS. 3A through 13 although it is present.

The bridge circuit (100) may include diodes (D1-D4) and resistors (R1, R2). Diodes (D1-D4) provide circuit protection against the higher current that may flow through the bridge circuit (100). In particular, diodes (D1-D4) may create a forced connection across an opened switch to prevent electrical arcing that may otherwise occur upon the opening of the switch.

As shown within FIGS. 1 and 3A through 13, diode (D2) is connected across switch (S2) and diode (D3) is connected across switch (S3). Resistor (R1) is connected to switch (S2) and to ground, and resistor (R2) is connected to switch (S3) and to ground.

Also shown within FIGS. 1 and 3A through 13 are supply rails. For example, FIGS. 1 and 3A through 11 show the presence of a supply rail (A-C) between node (A) and node (C), a supply rail (A-D) between node (A) and node (D), a supply rail (B-C) between node (B) and node (C), and a supply rail (B-D) between node (B) and node (D).

Diode (D1) and diode (D4) are placed only across the switches of the supply rail having the largest voltage. No diode (D1, D4) is placed across the switches of the supply rail of a lower voltage. Specifically, when the voltage potential (V1) is greater than the voltage potential (V2), diode (D1) is connected across switch (S1) and diode (D4) is connected across switch (S4); no diode is placed across either switch (S5) or switch (S6). This configuration is shown within FIGS. 1 and 3A through 13. Alternatively, when the voltage potential (V1) is less than the voltage potential (V2), diode (D1) may be connected across switch (S5) along with a connection of diode (D4) across switch (S6); no diode would be placed across either switch (S1) or switch (S4) in this alternative exemplary configuration.

Figure 2:
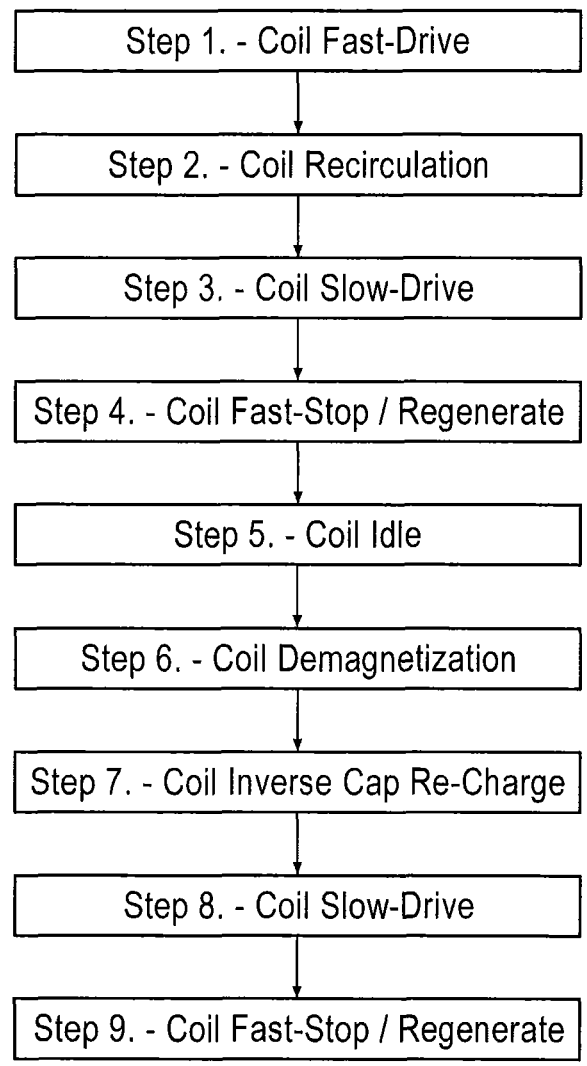
FIG. 2 is a composite flow diagram illustrating the operating mode sequence shown in FIGS. 3A through 11C.

The flexibility of the bridge circuit (100) allows for the execution of several operating modes. The Figures depict certain operating modes, but is not exhaustive to all possible operating modes. One example of an operating mode sequence is shown in FIGS. 2 through 11. FIG. 2 is a composite flow diagram illustrating the operation of the operating mode sequence shown in FIGS. 3A through 11.

FIGS. 3A, 3B, and 3C depict a Coil Fast-Drive mode. In this Coil Fast-Drive mode, the switch controller (200) instructs supply switch (S1) and sink switch (S3) to close and instructs the sink switch (S2) and supply switches (S4), (S5) and (S6) to open to create a current loop as shown in FIG. 3A. FIG. 3C details this switch configuration. Here, the current loop of the Coil Fast-Drive mode may include supply switch (S1), capacitor (C1), resistor (R2), sink switch (S3), and the LOAD. Prior to the switch closures and openings, the capacitor (C1) has been charged to a voltage potential (V2). As a result of the switch closures and openings depicted within FIG. 3A, the energy provided by the voltage potential (V2) stored within capacitor (C1) is discharged and current (I) passing through the LOAD as a positive current increases from level (0) to level (1), as depicted within FIG. 3B. "I" represents current and "t" represents time in the figures such as FIG. 3B. Process control proceeds from the Coil Fast-Drive mode to a Coil Recirculation mode.

In the Coil Recirculation mode of FIGS. 4A, 4B, and 4C, the positive current flowing through the LOAD is reduced to from level (1) to level (2), as depicted within FIG. 4B. As shown within FIG. 4A, the switch controller (200) instructs supply switches (S4), (S5) and (S6) to remain open, and sink switch (S3) to remain closed. In addition, the switch controller (200) instructs supply switch (S1) to open and sink switch (S2) to close. FIG. 4C details this switch configuration. Resulting from this switch configuration is the current loop shown in FIG. 4A. Here, the current loop of the Coil Recirculation mode may include sink switch (S2), resistor (R1), resistor (R2), sink switch (S3), and the LOAD. As a result of the switch closures and openings shown within FIG. 4A, current (I) passing through the LOAD as a positive current decreases to level (2). Process control proceeds from the Coil Recirculation mode to a Coil Slow-Drive mode.

Depicted within FIGS. 5A, 5B, and 5C is the Coil Slow-Drive mode. FIG. 5A shows that in this Coil Slow-Drive mode, the switch controller (200) instructs supply switches (S1), (S4) and (S6) to remain open, and sink switch (S3) to remain closed. Moreover, the switch controller (200) instructs sink switch (S2) to open and supply switch (S5) to close. FIG. 5C details this switch configuration. Here, the current loop of the Coil Slow-Drive mode may include supply switch (S5), the SUPPLY, resistor (R2), sink switch (S3), and the LOAD. As a result of the switch closures and openings depicted within FIG. 5A, current (I) passing through the LOAD as a positive current increases from level (2) to level (3), as depicted within FIG. 5B.

In the Coil Slow-Drive mode, the voltage potential (V1) of the SUPPLY depicted within FIG. 5A is less than the voltage potential (V2) of the charged capacitor (C1). As a consequence, the rate of increase from level (2) to level (3) is less than the rate of increase from level (0) to level (1), as shown within FIG. 5B. However, the voltage potential (V1) of the SUPPLY being greater than the voltage potential (V2) of the capacitor (C1) is also possible in other exemplary illustrations. When the voltage potential (V1) is greater than the voltage potential (V2), the rate of increase from level (2) to level (3) will be greater than the rate of increase from level (0) to level (1). With the voltage potential (V1) being greater than the voltage potential (V2), a reconfiguration of the circuit depicted within FIG. 5A would include the placement of diode (D1) across supply switch (S5) instead of being placed across supply switch (S1), and would further include the placement of diode (D4) across supply switch (S6) instead of being placed across supply switch (S4). As noted previously, in this exemplary illustration a diode must be placed across each supply switch located on the supply rail of the highest potential and no diode is to be placed across any supply switch located on a supply rail of a lower potential. Process control proceeds from the Coil Slow-Drive mode to a Coil Fast-Stop/Regenerate mode.

Depicted within FIGS. 6A, 6B, and 6C is the Coil Fast-Stop/Regenerate mode. FIG. 6A shows that in this Coil Fast-Stop/Regenerate mode, the switch controller (200) instructs supply switches (S1) and (S6) to remain open. Additionally, the switch controller (200) instructs sink switch (S3) and supply switch (S5) to open along with instructing the closure of sink switch (S2) and supply switch (S4). FIG. 6C details this switch configuration. Here, the current loop of the Coil Fast-Stop/Regenerate mode may include supply switch (S4), capacitor (C1), resistor (R1), sink switch (S2), and the LOAD. As a result of the switch closures and openings depicted within FIG. 6A, current (I) passing through the LOAD as a positive current decreases from level (3) to level (4), as depicted within FIG. 6B. Process control proceeds from the Coil Fast-Stop/Regenerate mode to the Coil Idle mode.

In the Coil Idle mode of FIGS. 7A, 7B, and 7C, the positive current flowing through the LOAD is reduced from level (4) to level (5), as depicted within FIG. 7B as follows. FIG. 7A shows that the switch controller (200) instructs supply switches (S1), (S5) and (S6) to remain open, and sink switch (S2) to remain closed. In addition, the switch controller (200) instructs supply switch (S4) to open and sink switch (S3) close. FIG. 7C details this switch configuration. Resulting from this switch configuration is the current loop shown in FIG. 7A. Here, the current loop of the Coil Idle mode may include sink switch (S2), resistor (R1), resistor (R2), sink switch (S3), and the LOAD. As a result of the switch closures and openings shown within FIG. 7A, current (I) passing through the LOAD as a positive current decreases to level (5). Process control proceeds from the Coil Idle mode to a Coil Demagnetization mode.

FIGS. 8A, 8B, and 8C depict the Coil Demagnetization mode. In this exemplary approach alternating drive polarity to avoid building residual magnetic fields is utilized. In this Coil Demagnetization mode, the switch controller (200) instructs supply switches (S1), (S4) and (S5) to remain open, and sink switch (S2) to remain closed. The switch controller (200) instructs sink switch (S3) to open and supply switch (S6) to close. FIG. 8C details this switch configuration. Resulting from this switch configuration is the current loop shown in FIG. 8A. Here, the current loop of the Coil Demagnetization mode may include supply switch (S6), the SUPPLY, resistor (R1), sink switch (S2), and the LOAD. As a result of the switch closures and openings shown within FIG. 8A, current (I) passing through the LOAD as a negative current decreases from level (5) to level (6). Process control proceeds from the Coil Demagnetization mode to a Coil Inverse Cap Re-Charge mode.

Depicted within FIGS. 9A, 9B, and 9C is the Coil Inverse Cap Re-Charge mode. In this Coil Inverse Cap Re-Charge mode, capacitor (C1) is recharged. Energy recovered from the LOAD recharges the capacitor (C1). FIG. 9A shows that the switch controller (200) instructs supply switches (S4) and (S5) to remain open. Additionally, the switch controller (200) instructs sink switch (S2) and supply switch (S6) to open along with instructing the closure of sink switch (S3) and supply switch (S1). FIG. 9C details this switch configuration. Here, the current loop of the Coil Inverse Cap Re-Charge mode may include supply switch (S1), capacitor (C1), resistor (R2), sink switch (S3), and the LOAD. As a result of the switch closures and openings depicted within FIG. 9A, current (I) passing through the LOAD as a negative current remains at level (6), as depicted within FIG. 9B. Process control proceeds from the Coil Inverse Cap Re-Charge mode to a Coil Slow-Drive mode.

Depicted within FIGS. 10A, 10B, and 10C is the Coil Slow-Drive mode. FIG. 10A shows that within this Coil Slow-Drive mode, the switch controller (200) instructs sink switch (S2), sink switch (S3) and supply switches (S4) and (S6) to remain open. Furthermore, the switch controller (200) instructs supply switch (S1) to open and supply switch (S5) to close. FIG. 10C details this switch configuration. Here, the current loop of the Coil Slow-Drive mode may include supply switch (S5), the SUPPLY, resistor (R2), sink switch (S3), and the LOAD. As a result of the switch closures and openings depicted within FIG. 10A, current (I) passing through the LOAD changes from a negative current to a positive current, increasing from level (6) to level (7), as depicted within FIG. 10B. Process control proceeds from the Coil Slow-Drive mode to a Coil Fast-Stop/Regenerate mode.

In the Coil Fast-Stop/Regenerate mode of FIGS. 11A, 11B, and 11C, the current (I) is reduced from level (7) to level (8) and the capacitor discharged, as depicted within FIG. 11B. FIG. 11A show that the switch controller (200) instructs supply switches (S1) and (S6) to remain open. Additionally, the switch controller (200) instructs sink switch (S3) and supply switch (S5) to open along with instructing the closure of sink switch (S2) and supply switch (S4). FIG. 11C details this switch configuration. Here, the current loop of the Coil Fast-Stop/Regenerate mode may include supply switch (S4), capacitor (C1), resistor (R1), sink switch (S2), and the LOAD. As a result of the switch closures and openings depicted within FIG. 11A, current (I) passing through the LOAD as a positive current decreases from level (7) to level (8), as depicted within FIG. 11B.

Figure 12:
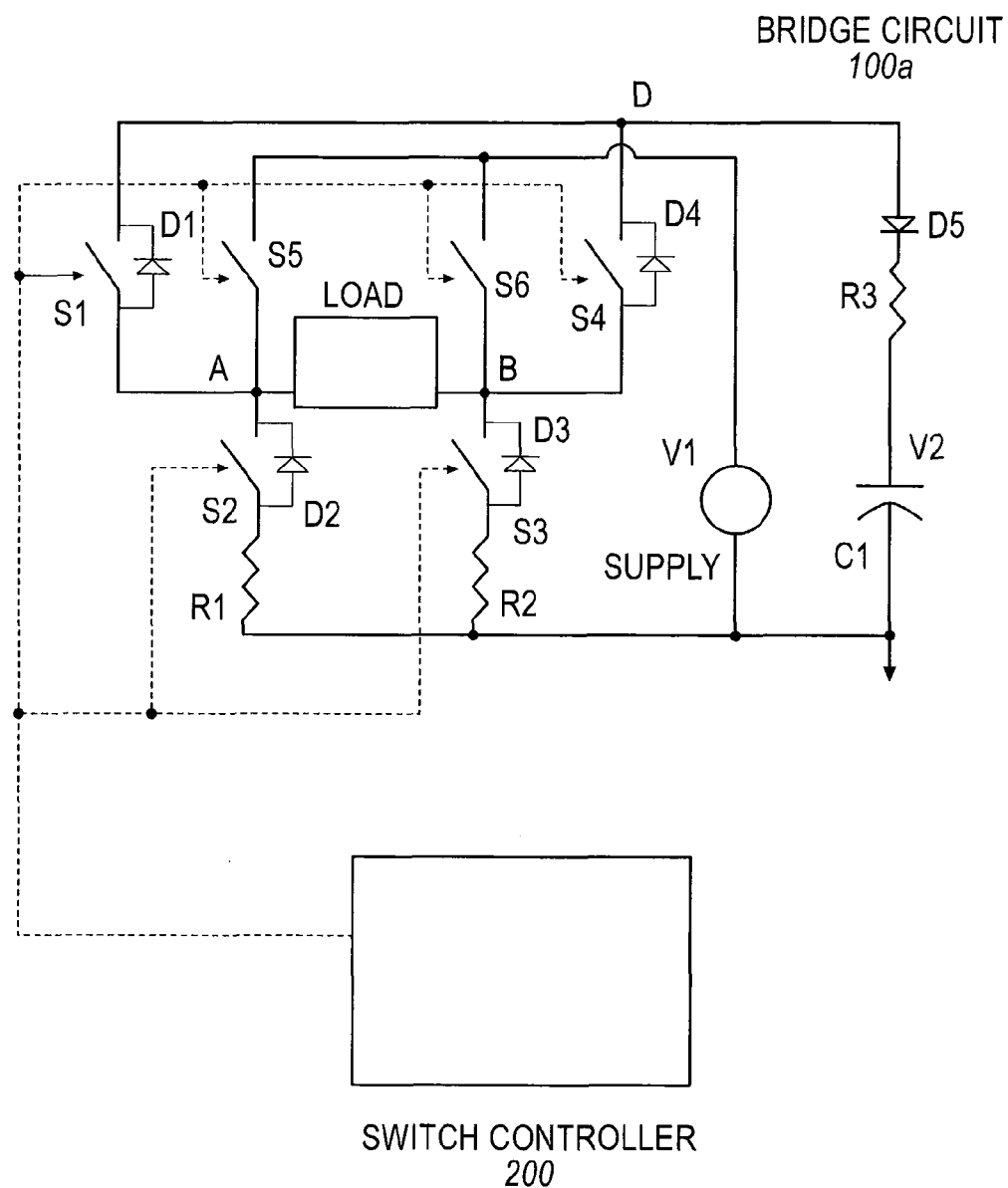
FIG. 12 is a simplified schematic diagram for another exemplary illustration of a drive circuit.

FIG. 12 is a simplified schematic diagram of an exemplary system similar to that which is depicted within FIG. 1. In addition to the elements shown within FIG. 1, the bridge circuit (100a) may include a resistor (R3) and a diode (D5). The resistor (R3) and diode (D5) being in series with the capacitor (C1) prevents the discharge of capacitor (C1) when the voltage potential (V1) is greater than the voltage potential (V2).

Figure 13:
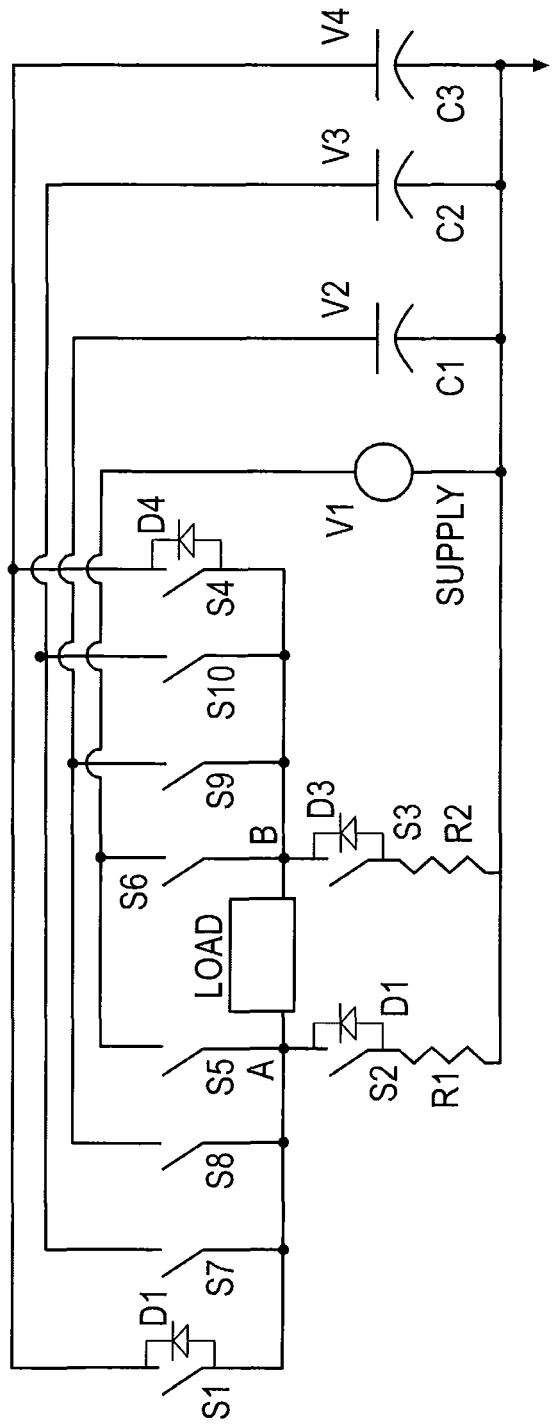
FIG. 13 is a simplified schematic diagram for another exemplary illustration showing a drive circuit having additional supply rails.

FIGS. 1 and 3A through 12 may show an H-bridge circuit with an additional "U" to another supply rail, such as a capacitive rail. However, there is no limit to the number or types of supply rails that can be added to the bridge circuits shown within FIGS. 1 and 3A through 12. As shown within FIG. 13, several different voltages can be applied to the LOAD in either polarity by adding additional pairs of switches (S7-S10) to separate supply rails. FIG. 13 depicts a simplified schematic diagram for the exemplary apparatus. FIG. 13 shows that the exemplary apparatus can have additional voltage sources. Although FIG. 13 shows the presence of additional power sources (C2, C3), the exemplary apparatus of the present invention may include additional or alternative power sources besides power sources (C2, C3). In this regard, for the number of additional power sources may be limited only by the space required for the additional circuitry. Additionally, a resistor and diode similar to resistor (R3) and diode (D5) of FIG. 12 can be place in series with any or all of the voltage potentials (V2-V4) shown within FIG. 13.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claimed invention.

Accordingly, it is to be understood that the above description is intended to be illustrative and not restrictive. Many embodiments and applications other than the examples provided would be upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

All terms used in the claims are intended to be given their broadest reasonable constructions and their ordinary meanings as understood by those skilled in the art unless an explicit indication to the contrary is made herein. In particular, use of the singular articles such as "a," "the," "said," etc. should be read to recite one or more of the indicated elements unless a claim recites an explicit limitation to the contrary.

What is claimed is:

1. A drive circuit comprising:
    a SUPPLY configured to output a first voltage potential, a first current generated by said first voltage potential being flowable through a LOAD;
    an energy storage device configured to output a second voltage potential, a second current generated by said second voltage potential being flowable through said LOAD,
    wherein each of said first and second currents is flowable through said LOAD in a flow direction and in a direction opposite to said flow direction; and
    a controller configured to determine which of the first voltage potential and the second voltage potential is of a highest potential and to control the first and second currents in response to the highest potential, wherein one of said first and second currents flows through said LOAD in response to the determination and the other of said currents does not flow through said LOAD.

2. The drive circuit according to claim 1, wherein said SUPPLY is from the group consisting of a battery, a power supply, and a DC voltage source.

3. The drive circuit according to claim 1, wherein said energy storage device is from the group consisting of a capacitor, a battery, a power supply, and a DC voltage source.

4. The drive circuit according to claim 1, wherein said first voltage potential is greater than said second voltage potential.

5. The drive circuit according to claim 1, wherein said first voltage potential is less than said second voltage potential.

6. The drive circuit according to claim 1, wherein said LOAD is from the group consisting of an inductive solenoid, a DC motor, and an electrical device.

7. The drive circuit according to claim 1, wherein switches are configurable to direct the flow of said first current through said LOAD in said flow direction.

8. The drive circuit according to claim 7, wherein each of said switches is connected to said LOAD.

9. The drive circuit according to claim 7, wherein said switches are reconfigurable to direct the flow of said first current through said LOAD in said direction opposite to said flow direction.

10. The drive circuit according to claim 7, wherein said switches are reconfigurable to direct the flow of said second current through said LOAD in said flow direction.

11. The drive circuit according to claim 7, wherein said switches are reconfigurable to direct the flow of said second current through said LOAD in said direction opposite to said flow direction.

12. The drive circuit according to claim 7, wherein a diode is connected across at least one of said switches, at least one of said switches being for a supply rail of the highest potential.

13. The drive circuit according to claim 12, wherein no diode is placed across others of said switches, said others of said switches being for at least one supply rail having a voltage less than said highest potential.

14. A method of operating a drive circuit, the method comprising:
    flowing a first current through a LOAD in a flow direction or in a direction opposite to the flow direction, a first voltage source generating said first current; and thereafter,
    flowing a second current through said LOAD in said flow direction or in said direction opposite to the flow direction, a second voltage source generating said second current, wherein said directions of said first and second current is determined based on which of a first voltage potential associated with the first voltage source and a second voltage potential associated with a second voltage source is of the highest potential.

15. The method according to claim 14, controlling at least one switch for directing flow of said first current through said LOAD in said flow direction.

16. The method according to claim 15, controlling said at least one switch for redirecting said flow of said first current through said LOAD in said direction opposite to said flow direction.

17. The method according to claim 15, controlling said at least one switch for discontinuing said flow of said first current through said LOAD and initiating flow of said second current through said LOAD.

18. The method according to claim 17, wherein said flow of said second current is in said flow direction.

19. The method according to claim 17, wherein said flow of said second current is in said direction opposite to said flow direction.

20. The method according to claim 17, controlling said at least one switch for discontinuing said flow of said second current through said LOAD and recommencing said flow of said first current through said LOAD.

21. The drive circuit according to claim 12, wherein said supply rail includes a plurality of supply rails each including a separate SUPPLY configured to output a respective voltage potential and wherein said controller is configured to determine which of the voltage potentials is of the highest potential.

22. The drive circuit according to claim 21, wherein each of said supply rails includes at least one resistor and at least one diode connected in series.

23. A method of operating a drive circuit including a plurality of switches with a first switch, a second switch, a third switch, a fourth switch, a fifth switch and a sixth switch, and a plurality of loops including a first loop, a second loop, a third loop, a fourth loop, a fifth loop, a sixth loop, a seventh loop, an eighth loop and a ninth loop, the method comprising:
    flowing a current through a LOAD via the first loop created by closing the first switch and the third switch;
    flowing current through the LOAD via the second loop created by opening the first switch and closing the second switch;
    flowing current through the LOAD via the third loop created by opening the second switch and closing the fifth switch;
    flowing current through the LOAD via the fourth loop created by opening the third switch and the fifth switch and closing the second switch and the fourth switch;
    flowing the current through the LOAD via the fifth loop created by opening the fourth switch and closing the third switch;
    flowing current through the LOAD via the sixth loop created by opening the third switch and closing the sixth switch;
    flowing current through the LOAD via the seventh loop created by opening the second switch and the sixth switch and closing the first switch and the third switch;
    flowing current through the LOAD via the eighth loop created by opening the first switch and closing the fifth switch; and
    flowing current through the LOAD via the ninth loop created by opening the third switch and the fifth switch and closing the second switch and the fourth switch, wherein energy is one of injected or recovered from the LOAD via the current flows through the plurality of loops;

wherein the first switch, the second switch, the third switch, the fourth switch, the fifth switch, and the sixth switch are each in an open initial state.

\* \* \* \* \*